United States Patent
Yoshimatsu

(10) Patent No.: US 11,562,977 B2
(45) Date of Patent: Jan. 24, 2023

(54) SEMICONDUCTOR DEVICE COMPRISING A RESIN CASE AND A WIRING MEMBER THAT IS FLAT IN THE RESIN CASE

(71) Applicant: Mitsubishi Electric Corporation, Tokyo (JP)

(72) Inventor: Naoki Yoshimatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/269,480

(22) PCT Filed: Nov. 20, 2018

(86) PCT No.: PCT/JP2018/042805
§ 371 (c)(1),
(2) Date: Feb. 18, 2021

(87) PCT Pub. No.: WO2020/105114
PCT Pub. Date: May 28, 2020

(65) Prior Publication Data
US 2021/0313295 A1    Oct. 7, 2021

(51) Int. Cl.
*H01L 23/00* (2006.01)
*H01L 23/043* (2006.01)
(Continued)

(52) U.S. Cl.
CPC ............ *H01L 24/40* (2013.01); *H01L 23/043* (2013.01); *H01L 23/49838* (2013.01);
(Continued)

(58) Field of Classification Search
CPC ... H01L 23/3735; H01L 25/072; H01L 24/37; H01L 23/057; H01L 25/18; H01L 25/07;
(Continued)

(56) References Cited

U.S. PATENT DOCUMENTS

| 2014/0246769 A1 | 9/2014 | Takahashi et al. |
| 2015/0061098 A1 | 3/2015 | Imoto et al. |
| 2016/0104651 A1* | 4/2016 | Asada ..................... H01L 24/40 361/783 |

FOREIGN PATENT DOCUMENTS

| JP | 2015-046416 A | 3/2015 |
| WO | 2013/058038 A1 | 4/2013 |

(Continued)

OTHER PUBLICATIONS

An Office Action; "Notice of Reasons for Refusal", mailed by the Japanese Patent Office dated Oct. 26, 2021, which corresponds to Japanese Patent Application No. 2020-557062 and is related to U.S. Appl. No. 17/269,480; with English language translation.

(Continued)

*Primary Examiner* — Alexander O Williams
(74) *Attorney, Agent, or Firm* — Studebaker & Brackett PC

(57) ABSTRACT

A semiconductor device includes a substrate, a resin case, and a wiring member having an exposed portion adjacent to a first fixing portion fixed in a wall surface of the resin case and exposed to outside, and a second fixing portion fixed in the wall surface of the resin case at a position different from the first fixing portion with respect to a portion extending from the first fixing portion into the resin case, in which the wiring member is bonded to a surface of the semiconductor element by solder in the resin case, and has a plate shape having a length, a thickness, and a width, in which the wiring member has the thickness being uniform and is flat in the resin case, and the width of the second fixing portion is narrower than the width of the exposed portion.

5 Claims, 11 Drawing Sheets

(51) Int. Cl.
　　　*H01L 23/498*　　　(2006.01)
　　　*H01L 25/07*　　　(2006.01)
　　　*H01L 25/18*　　　(2006.01)

(52) U.S. Cl.
　　　CPC ...... *H01L 23/49861* (2013.01); *H01L 25/071* (2013.01); *H01L 25/18* (2013.01); *H01L 2224/40137* (2013.01); *H01L 2924/181* (2013.01)

(58) Field of Classification Search
　　　CPC ..... H01L 23/498; H01L 23/043; H01L 23/00; H01L 2924/181; H01L 2224/40137; H01L 25/071; H01L 23/49861; H01L 23/49838; H01L 24/40
　　　USPC ........................................................ 257/666
　　　See application file for complete search history.

(56) References Cited

FOREIGN PATENT DOCUMENTS

WO　　　2017/169134 A1　　10/2017
WO　　　2017169134 A1 *　10/2017　............. H01L 23/48

OTHER PUBLICATIONS

International Search Report issued in PCT/JP2018/042805; dated Feb. 12, 2019.

\* cited by examiner

F I G. 2 1
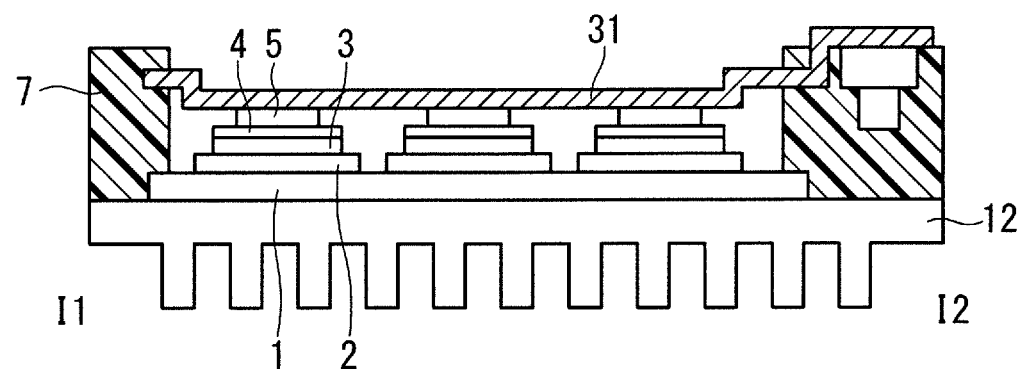

SEMICONDUCTOR DEVICE COMPRISING A RESIN CASE AND A WIRING MEMBER THAT IS FLAT IN THE RESIN CASE

TECHNICAL FIELD

The present invention relates to a semiconductor device, and more particularly to a semiconductor device used for an inverter for controlling a motor of an electric vehicle or a train, or a converter for regeneration, or the like.

BACKGROUND ART

Conventionally, a semiconductor device including a wiring member integrally molded in a resin case has been disclosed (for example, refer to Patent Documents 1 and 2). The wiring member is bonded to an electrode provided on the upper surface of a semiconductor element by solder, and a part of the wiring member is exposed to the outside. In such a configuration, in order to improve the solder bonding state between the wiring member and the semiconductor element, high accuracy in the height direction of the wiring member is required. Here, the height direction of the wiring member indicates the direction of the spacing between the wiring member and the semiconductor element.

PRIOR ART DOCUMENTS

Patent Documents

[Patent Document 1] WO2013/058038
[Patent Document 2] Japanese Patent Application Laid-Open No. 2015-46416

SUMMARY

Problem to be Solved by the Invention

In the manufacturing process of a semiconductor device, a wiring member and a semiconductor element are bonded by solder at a high temperature of about 200° C. to 250° C. At this time, the resin case and the wiring member are also in a high temperature state, and due to their different linear expansion coefficients, a strain is generated between the resin case and the wiring member.

In Patent Documents 1 and 2, the wiring member is subject to bending in order to alleviate the above strain. However, the accuracy of the position in the height direction of the bent wiring member is not high; therefore, bonding of the wiring member to the semiconductor element by solder is not performed favorably on some occasions.

The present invention has been made to solve such a problem, and an object of the present invention is to provide a semiconductor device capable of improving the accuracy of the position in the height direction of a wiring member.

Means to Solve the Problem

A semiconductor device includes a substrate provided with a semiconductor element, a resin case provided on a periphery of the substrate, and a wiring member having an exposed portion adjacent to a first fixing portion fixed in a wall surface of the resin case and exposed to outside, and a second fixing portion fixed in the wall surface of the resin case at a position different from the first fixing portion with respect to a portion extending from the first fixing portion into the resin case, in which the wiring member is bonded to a surface of the semiconductor element opposite to the substrate by solder in the resin case, and has a plate shape having a length, a thickness, and a width, in which the wiring member has the thickness being uniform and is flat in the resin case, and the width of the second fixing portion is narrower than the width of the exposed portion.

Effects of the Invention

A semiconductor device according to the present invention includes a substrate provided with a semiconductor element, a resin case provided on a periphery of the substrate, and a wiring member having an exposed portion adjacent to a first fixing portion fixed in a wall surface of the resin case and exposed to outside, and a second fixing portion fixed in the wall surface of the resin case at a position different from the first fixing portion with respect to a portion extending from the first fixing portion into the resin case, in which the wiring member is bonded to a surface of the semiconductor element opposite to the substrate by solder in the resin case, and has a plate shape having a length, a thickness, and a width, in which the wiring member has the thickness being uniform and is flat in the resin case, and the width of the second fixing portion is narrower than the width of the exposed portion. Therefore, improvement in the accuracy of the position in the height direction of a wiring member is ensured.

The explicit purpose, feature, phase, and advantage of the present invention will be described in detail hereunder with attached drawings.

BRIEF DESCRIPTION OF DRAWINGS

FIG. 21 is a cross-sectional view illustrating a cross-section taken along line I1-I2 in FIG. 20.

DESCRIPTION OF EMBODIMENTS

Embodiments of the present invention will be described with reference to the drawings.

<Related Art>

A related art relating to Embodiments will be described.

Figure 11:
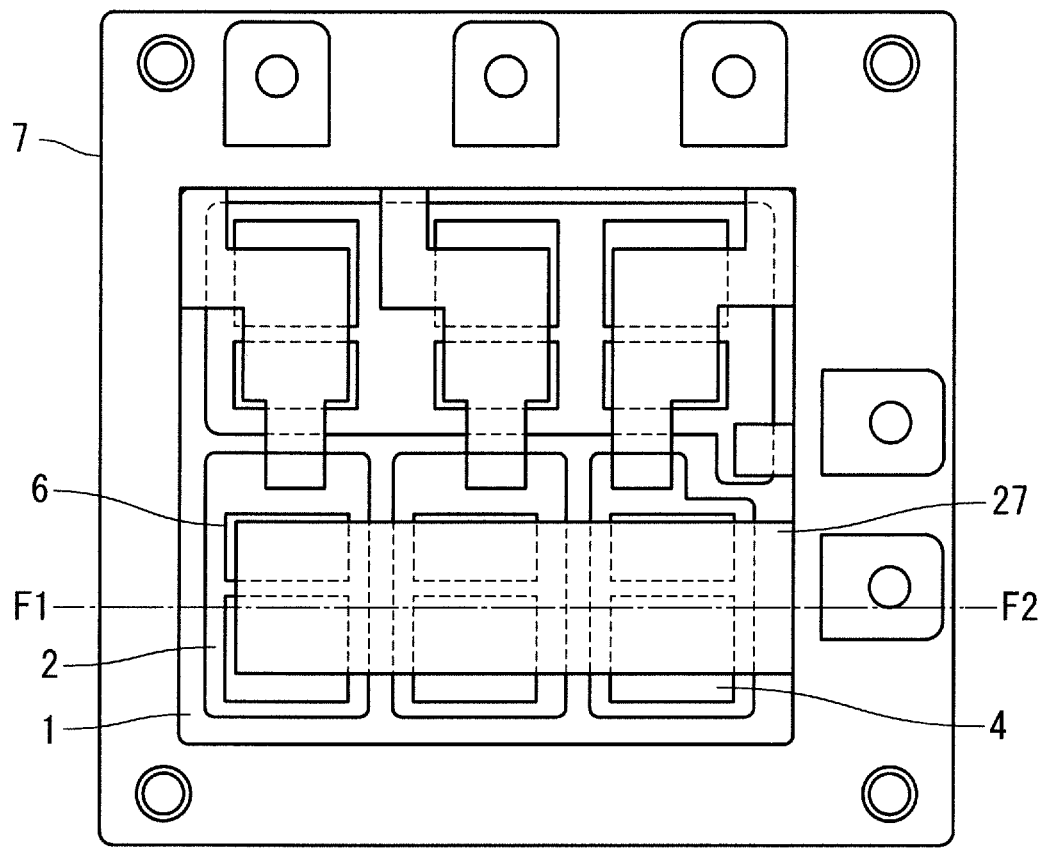
FIG. 11 is a plan view illustrating a configuration example of a semiconductor device according to a related art.
Figure 12:
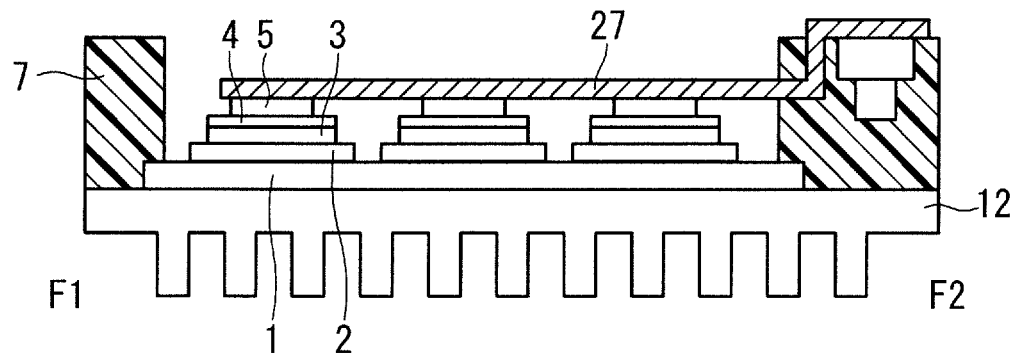
FIG. 12 is a cross-sectional view illustrating a cross-section taken along line F1-F2 in FIG. 11.

FIG. 11 is a plan view illustrating a configuration example of a semiconductor device according to the related art. FIG. 12 is a cross-sectional view illustrating a cross-section taken along line F1-F2 in FIG. 11. Note that FIGS. 11 and 12 illustrate the state before the resin is injected into the resin case 7.

The semiconductor device illustrated in FIGS. 11 and 12 is provided with circuit patterns 2 on a substrate 1. Semiconductor elements 4 and 6 are bonded on the circuit patterns 2 via solder 3. A heat sink 12 is provided on the back surface of the substrate 1.

The resin case 7 is provided on the periphery of the substrate 1. A wiring member 27 is integrally molded in the resin case 7. The wiring member 27 is bonded to the surface of the semiconductor elements 4 and 6 opposite to the substrate 1 via solder 5, and one end thereof is exposed to the outside of the resin case 7.

In the configuration of the semiconductor device illustrated in FIGS. 11 and 12, the accuracy of the position in the height direction of the wiring member 27 varies. In the example of FIG. 12, the position in the height direction of the wiring member 27 is appropriate; therefore, the favorable bonding state between the wiring member 27 and the semiconductor elements 4 and 6 with the solder 5 is established. However, as illustrated in FIGS. 13 and 14, when the position in the height direction of the wiring member 27 is not appropriate, the bonding state between the wiring member 27 and the semiconductor elements 4 and 6 by the solder 5 deteriorates.

Figure 13:
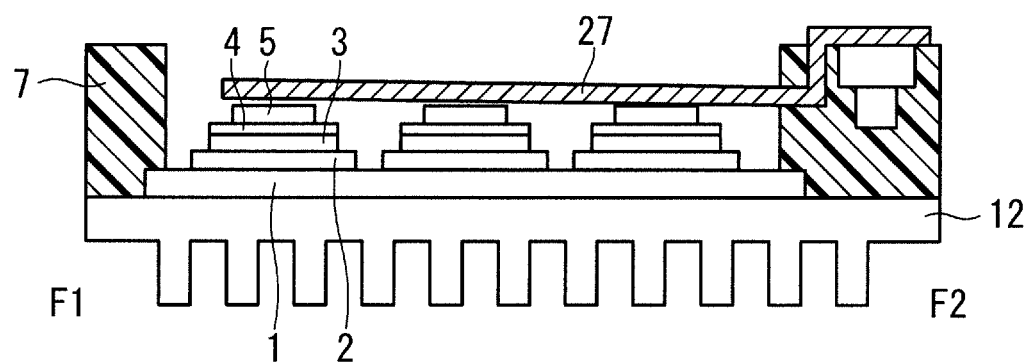
FIG. 13 is a cross-sectional view illustrating a cross-section taken along line F1-F2 in FIG. 11.
Figure 14:
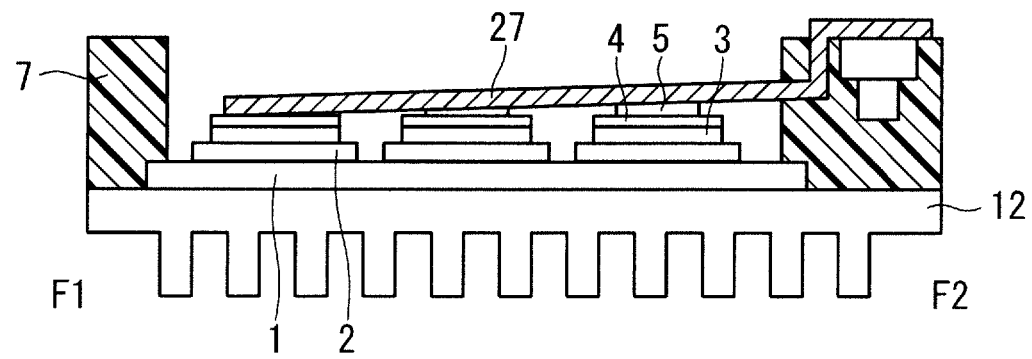
FIG. 14 is a cross-sectional view illustrating a cross-section taken along line F1-F2 in FIG. 11.

Specifically, in the example of FIG. 13, there is a place where a gap between the wiring member 27 and the semiconductor element 4 is wide, and the wiring member 27 and the semiconductor element 4 cannot be bonded by the solder 5 at such a place. Further, in the example of FIG. 14, there is a place where a gap between the wiring member 27 and the semiconductor element 4 is small, and in such a place, the solder 5 protrudes when the wiring member 27 and the semiconductor element 4 are bonded.

Figure 15:
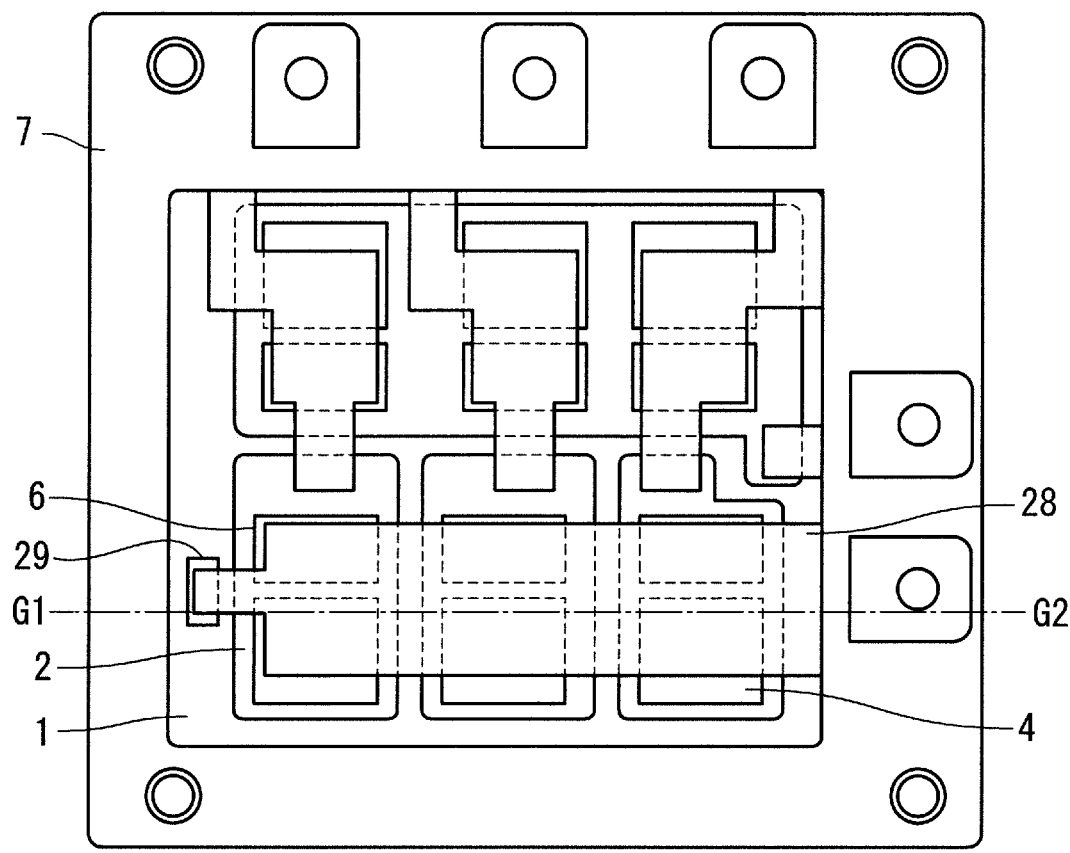
FIG. 15 is a plan view illustrating a configuration example of a semiconductor device according to a related art.
Figure 16:
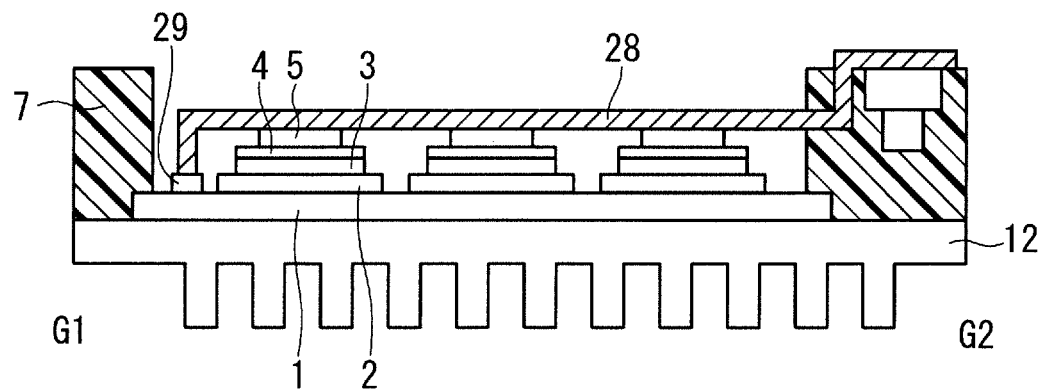
FIG. 16 is a cross-sectional view illustrating a cross-section taken along line G1-G2 in FIG. 15.

FIG. 15 is a plan view illustrating a configuration example of a semiconductor device according to the related art. FIG. 16 is a cross-sectional view illustrating a cross-section taken along line G1-G2 in FIG. 15. Note that FIGS. 15 and 16 illustrate the state before the resin is injected into the resin case 7.

The semiconductor device illustrated in FIGS. 15 and 16 is provided with a circuit pattern 29 on a substrate 1. The circuit pattern 29 is isolated from the circuit patterns 2. A part of a wiring member 28 extends toward the substrate 1 and is in contact with the circuit pattern 29. Note that the circuit pattern 29 may be a protrusion. Other configurations are the same as those of the semiconductor device illustrated in FIGS. 11 and 12; therefore, description thereof will be omitted here.

In the configuration of the semiconductor device illustrated in FIGS. 15 and 16, the control of the position in the height direction of the wiring member 28 is performable; however, a space for providing the circuit pattern 29 and a space for insulating between the circuit pattern 29 and the circuit patterns 2 are required to be provided. Consequently, the downsizing of the semiconductor device illustrated in FIGS. 15 and 16 is difficult to achieve.

Figure 17:
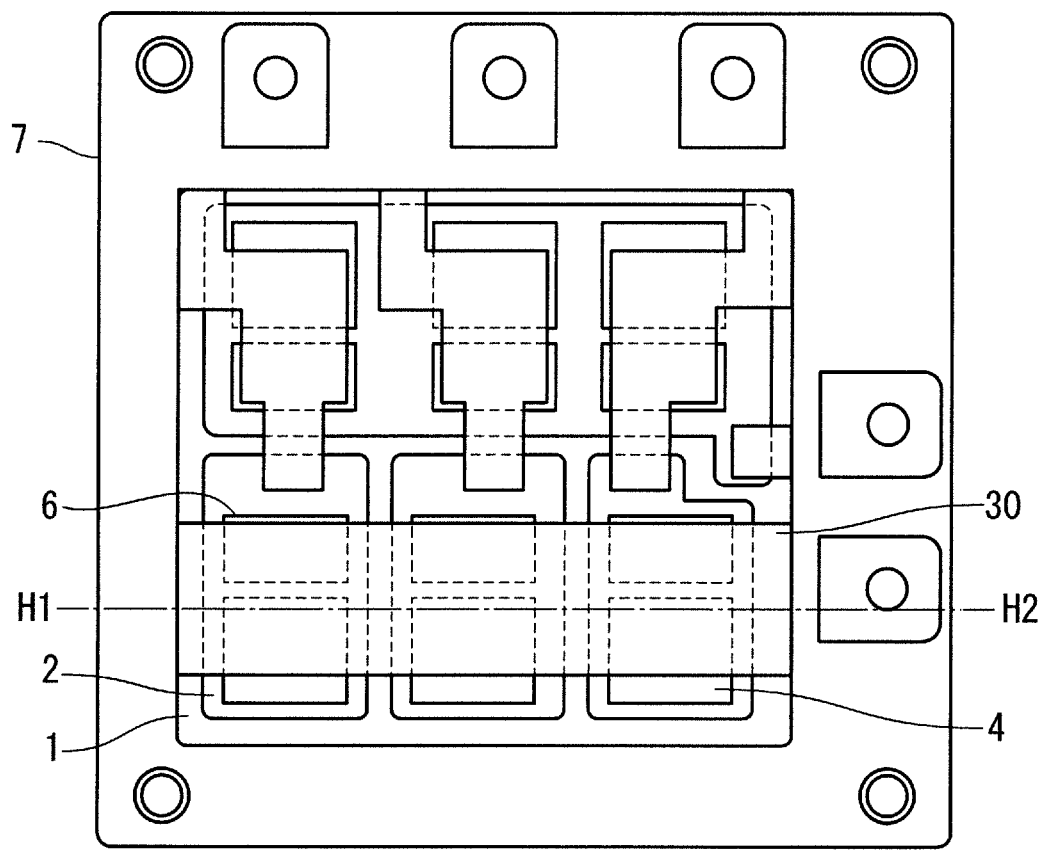
FIG. 17 is a plan view illustrating a configuration example of a semiconductor device according to a related art.
Figure 18:
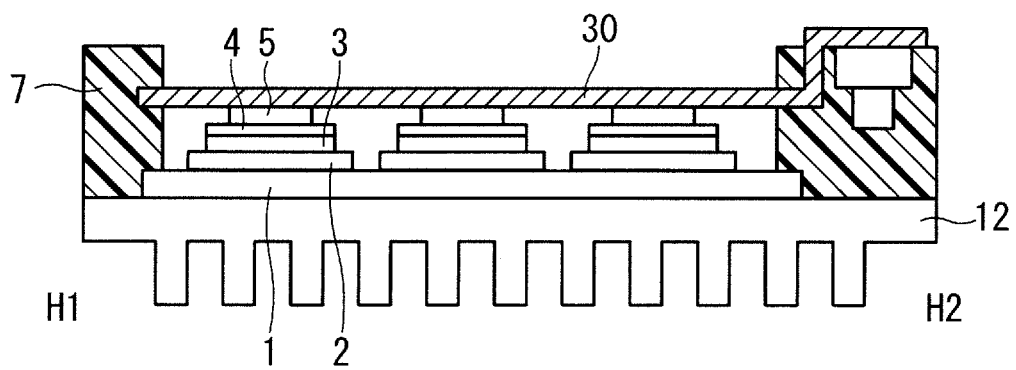
FIG. 18 is a cross-sectional view illustrating a cross-section taken along line H1-H2 in FIG. 17.

FIG. 17 is a plan view illustrating a configuration example of a semiconductor device according to the related art. FIG. 18 is a cross-sectional view illustrating a cross-section taken along line H1-H2 in FIG. 17. Note that FIGS. 17 and 18 illustrate the state before the resin is injected into the resin case 7.

In the semiconductor device illustrated in FIGS. 17 and 18, one end of a wiring member 30 is exposed from the inside of the wall surface of the resin case 7 to the outside, and the other end is fixed inside the wall surface of the resin case 7. Other configurations are the same as those of the semiconductor device illustrated in FIGS. 11 and 12; therefore, description thereof will be omitted here.

Figure 19:
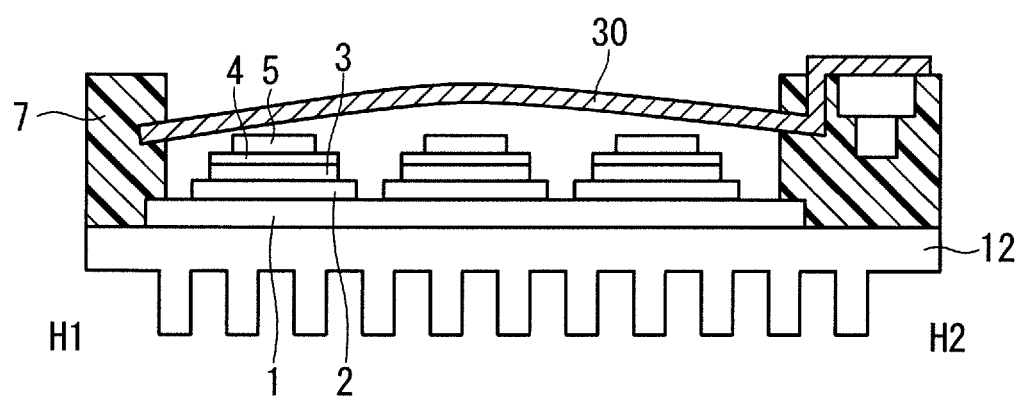
FIG. 19 is a cross-sectional view illustrating a cross-section taken along line H1-H2 in FIG. 17.

In the configuration of the semiconductor device illustrated in FIGS. 17 and 18, a strain is generated between the resin case 7 and the wiring member 30 when the wiring member 30 and the semiconductor elements 4 are bonded by the solder 5 under a high temperature state. As a result, as illustrated in FIG. 19, the wiring member 30 is curved. When the wiring member 30 is curved, the position in the height direction of the wiring member 30 varies, and the wiring member 30 and the semiconductor elements 4 cannot be bonded by the solder 5.

Figure 20:
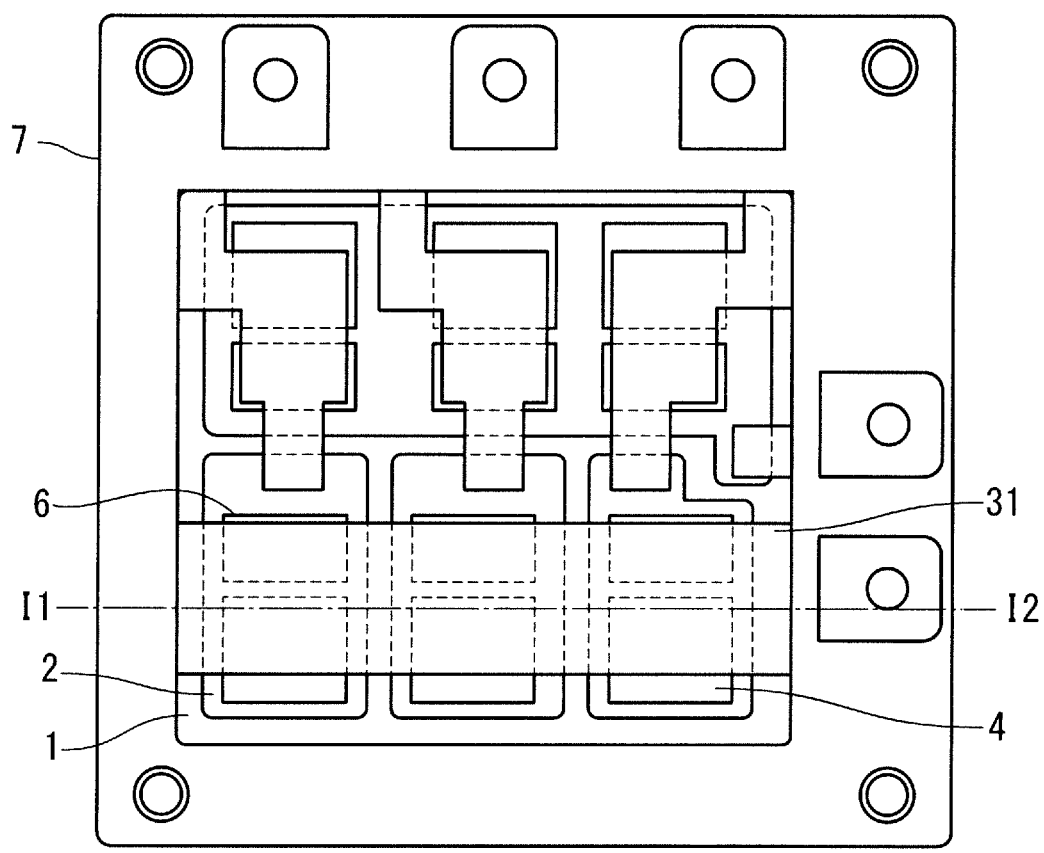
FIG. 20 is a plan view illustrating a configuration example of a semiconductor device according to a related art.

FIG. 20 is a plan view illustrating a configuration example of a semiconductor device according to the related art. FIG. 21 is a cross-sectional view illustrating a cross-section taken along line I1-I2 in FIG. 20. Note that FIGS. 20 and 21 illustrate the state before the resin is injected into the resin case 7.

In the semiconductor device illustrated in FIGS. 20 and 21, a wiring member 31 is bent in the resin case 7. Other configurations are the same as those of the semiconductor device illustrated in FIGS. 17 and 18; therefore, description thereof will be omitted here.

In the configuration of the semiconductor device illustrated in FIGS. 20 and 21, a strain generated between the resin case 7 and the wiring member 31 is alleviated when the wiring member 31 and the semiconductor elements 4 are bonded by the solder 5 under a high temperature state. However, the accuracy of the position in the height direction of the bent wiring member 31 is not high; therefore, bonding of the wiring member 31 to the semiconductor elements 4 with the solder 5 is not performed favorably on some occasions. In addition, costs are involved in bending the wiring member 31.

As described above, it cannot be said that the semiconductor devices according to the related arts described above improve the accuracy of the position in the height direction of the wiring member. Embodiments of the present invention have been made to solve the problems of the semiconductor device according to the related arts, and will be described in detail below.

Embodiment 1

Figure 1:
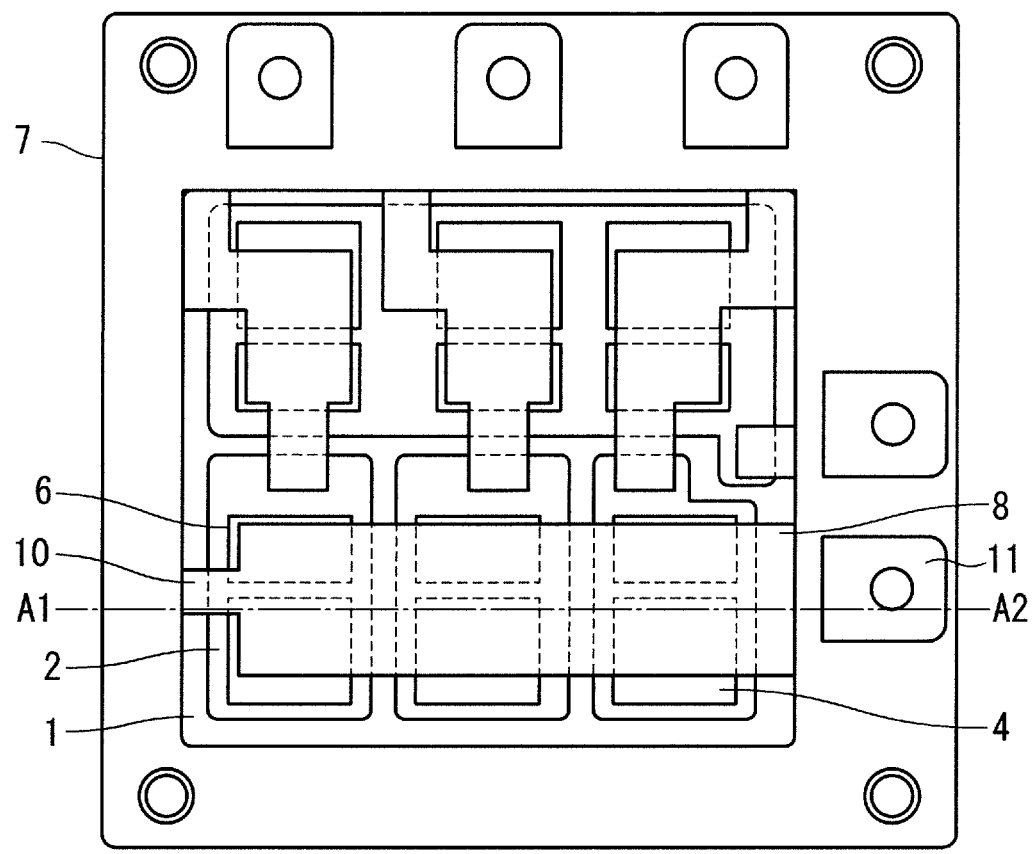
FIG. 1 is a plan view illustrating a configuration example of a semiconductor device according to Embodiment 1 of the present invention.
Figure 2:
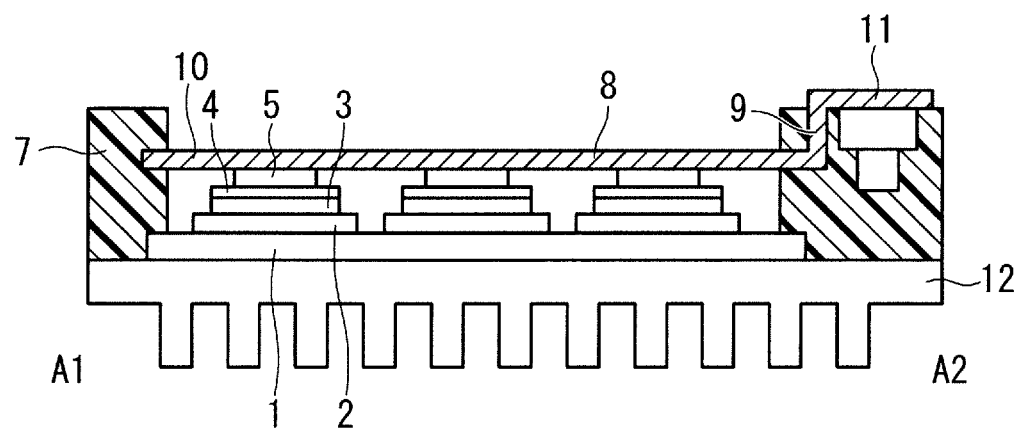
FIG. 2 is a cross-sectional view taken along line A1-A2 in FIG. 1.

FIG. 1 is a plan view illustrating a configuration example of a semiconductor device according to Embodiment 1. FIG. 2 is a cross-sectional view taken along line A1-A2 in FIG. 1. Note that FIGS. 1 and 2 illustrate the state before a resin is injected into the resin case 7.

As illustrated in FIGS. 1 and 2, the semiconductor device according to Embodiment 1 is characterized by a second fixing portion 10 of a wiring member 8. Other configurations are the same as those of the semiconductor device according to the related art illustrated in FIGS. 11 and 12; therefore, description thereof will be omitted here.

The wiring member 8 has an exposed portion 11 adjacent to a first fixing portion 9 fixed in the wall surface of the resin case 7 and exposed to the outside, and a second fixing portion 10 fixed in the wall surface of the resin case 7 at a position different from the first fixing portion 9 with respect to a portion extending from the first fixing portion 9 into the resin case 7, in which the wiring member 8 is bonded to the surface of the semiconductor elements 4 and 6 opposite to a substrate 1 in the resin case 7 by the solder 5, and has a plate shape having a length, a thickness, and a width. Further, the wiring member 8 has a uniform thickness and is flat in the resin case 7, and is not subject to bending. Further, the second fixing portion 10 of the wiring member 8 is formed by punching so as to have a narrow width. Therefore, the width of the second fixed portion 10 is narrower than the width of the exposed portion 11.

As described above, in the manufacturing process of a semiconductor device, a wiring member and a semiconductor element are bonded by solder at a high temperature of about 200° C. to 250° C. At this time, the resin case and the wiring member are also in a high temperature state, and due to their different linear expansion coefficients, a strain is generated between the resin case and the wiring member. Meanwhile, in the semiconductor device according to Embodiment 1, the width of the second fixing portion 10 of the wiring member 8 is narrowed to facilitate deformation; therefore, the second fixing portion 10 alleviates the strain generated when it is at a high temperature.

As described above, according to Embodiment 1, the second fixing portion 10 of the wiring member 8 alleviates the strain generated when it is at high temperature; therefore, the position in the height direction of the wiring member 8 does not shift. Therefore, the accuracy of the position in the height direction of the wiring member 8 is improved. Further, the accuracy of the position in the height direction of the wiring member 8 is improved; therefore, a favorable bonding state between the wiring member 8 and the semiconductor elements 4 and 6 by the solder 5 is established. Further, the wiring member 8 is not subject to bending, the cost of the wiring member 8 can be suppressed.

Embodiment 2

Figure 3:
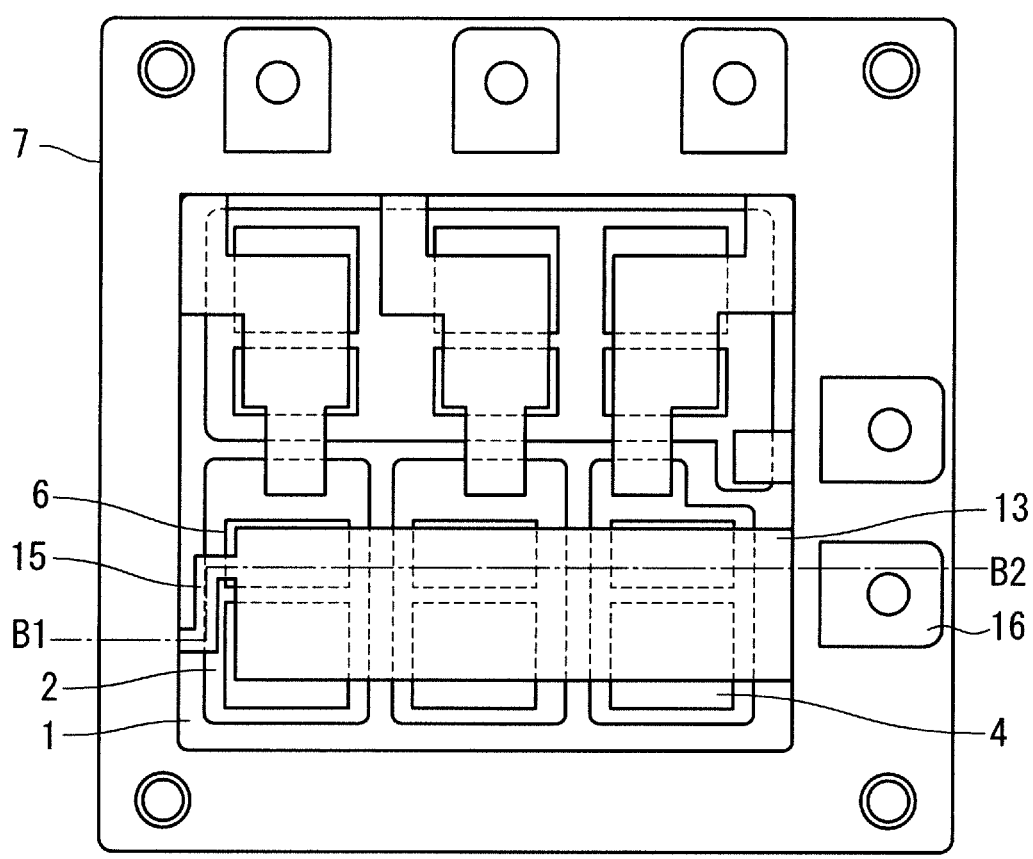
FIG. 3 is a plan view illustrating a configuration example of a semiconductor device according to Embodiment 2 of the present invention.
Figure 4:
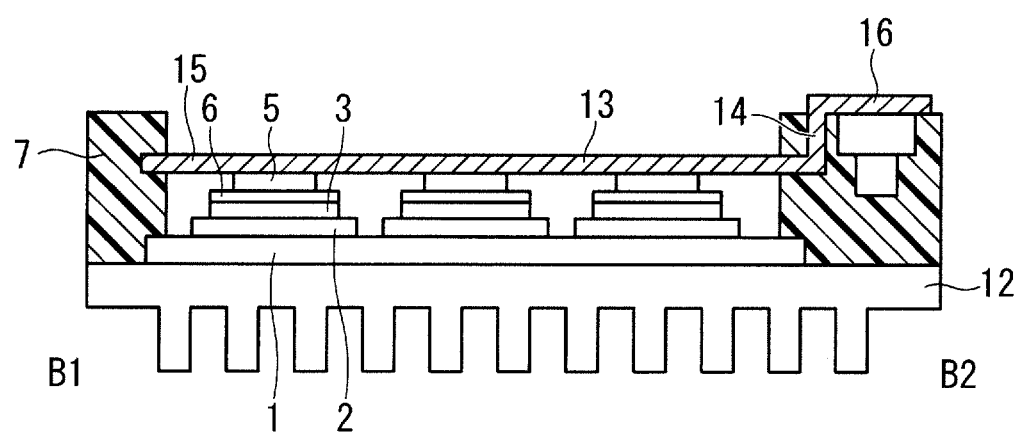
FIG. 4 is a cross-sectional view taken along line B1-B2 in FIG. 3.

FIG. 3 is a plan view illustrating a configuration example of a semiconductor device according to Embodiment 2. FIG. 4 is a cross-sectional view taken along line B1-B2 in FIG. 3. Note that FIGS. 3 and 4 illustrate the state before a resin is injected into a resin case 7.

As illustrated in FIGS. 3 and 4, the semiconductor device according to Embodiment 2 is characterized by a second fixing portion 15 of a wiring member 13. A first fixing portion 14 of the wiring member 13 corresponds to the first fixing portion 9 of FIGS. 1 and 2, and an exposed portion 16 of the wiring member 13 corresponds to the exposed portion 11 of FIGS. 1 and 2. Other configurations are the same as those of the semiconductor device according to Embodiment 1 illustrated in FIGS. 1 and 2; therefore, the detail description thereof will be omitted here.

In the wiring member 13, the second fixing portion 15 has a bent shape in a plan view. Specifically, the second fixing portion 15 has a crank shape. In the example of FIGS. 3 and 4, although a case is illustrated where the second fixing portion 15 has a crank shape, the present invention is not limited thereto. For example, the second fixing portion 15 may have a curved shape.

As described above, according to Embodiment 2, by forming the second fixing portion 15 of the wiring member 13 into a bent shape, the effect of alleviating the strain is enhanced more than that with the semiconductor device according to Embodiment 1.

Embodiment 3

Figure 5:
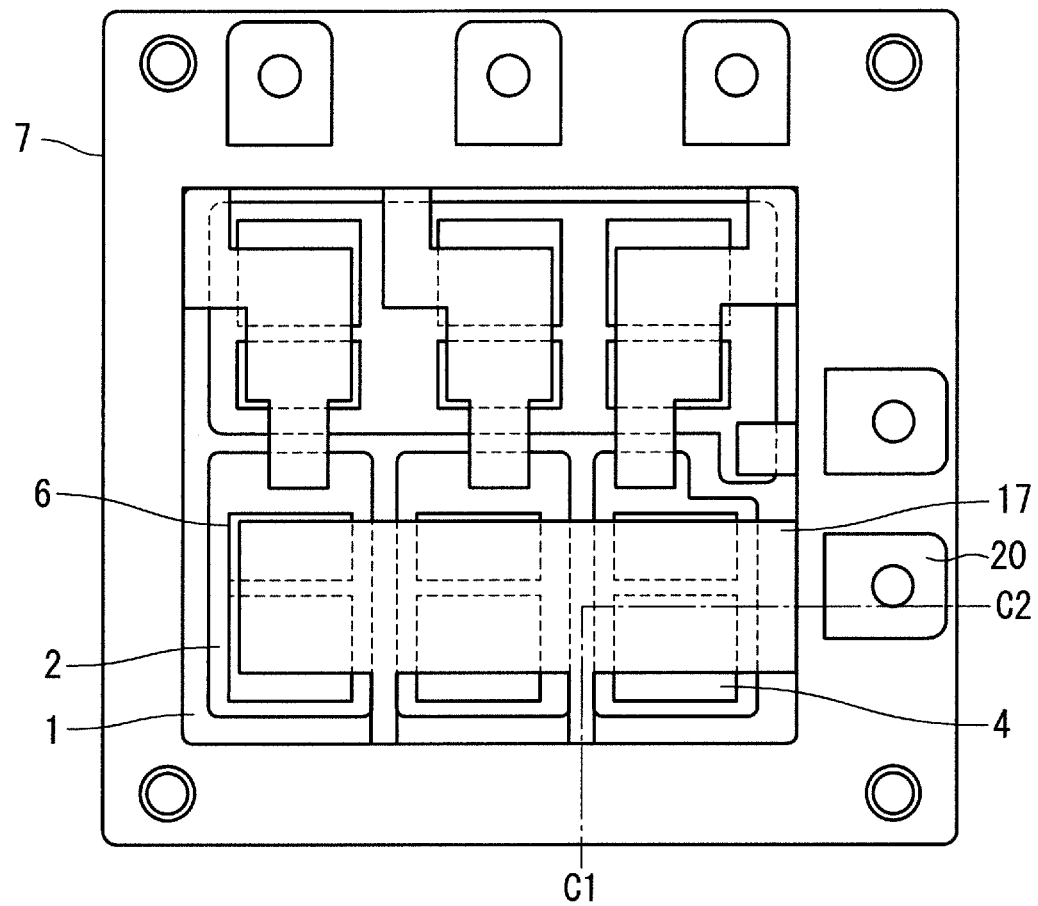
FIG. 5 is a plan view illustrating a configuration example of a semiconductor device according to Embodiment 3 of the present invention.
Figure 6:
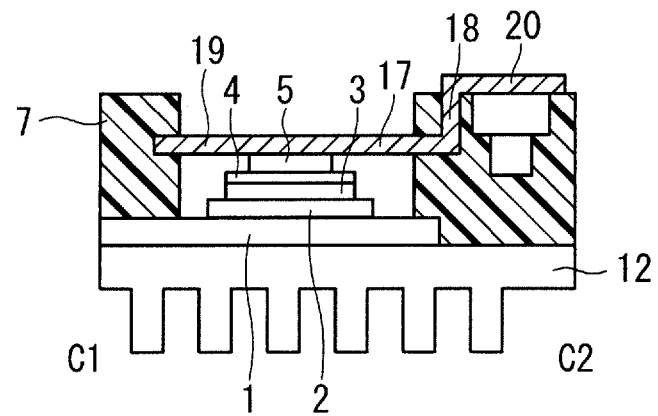
FIG. 6 is a cross-sectional view taken along line C1-C2 in FIG. 5.

FIG. 5 is a plan view illustrating a configuration example of a semiconductor device according to Embodiment 3. FIG. 6 is a cross-sectional view taken along line C1-C2 in FIG. 5. Note that FIGS. 5 and 6 illustrate the state before a resin is injected into a resin case 7.

As illustrated in FIGS. 5 and 6, the semiconductor device according to Embodiment 3 is characterized by a second fixing portion 19 of a wiring member 17. A first fixing portion 18 of the wiring member 17 corresponds to the first fixing portion 9 of FIGS. 1 and 2, and an exposed portion 20 of the wiring member 17 corresponds to the exposed portion 11 of FIGS. 1 and 2. Other configurations are the same as those of the semiconductor device according to Embodiment 1 illustrated in FIGS. 1 and 2; therefore, the detail description thereof will be omitted here.

The second fixing portion 19 of the wiring member 17 is fixed in the wall surface adjacent to the wall surface of the resin case 7 to which the first fixing portion 18 is fixed.

As described above, according to Embodiment 3, the second fixing portion 19 alleviates the strain generated when it is at high temperature; therefore, the position in the height direction of the wiring member 17 does not shift. Therefore, the accuracy of the position in the height direction of the wiring member 17 is improved.

Embodiment 4

Figure 7:
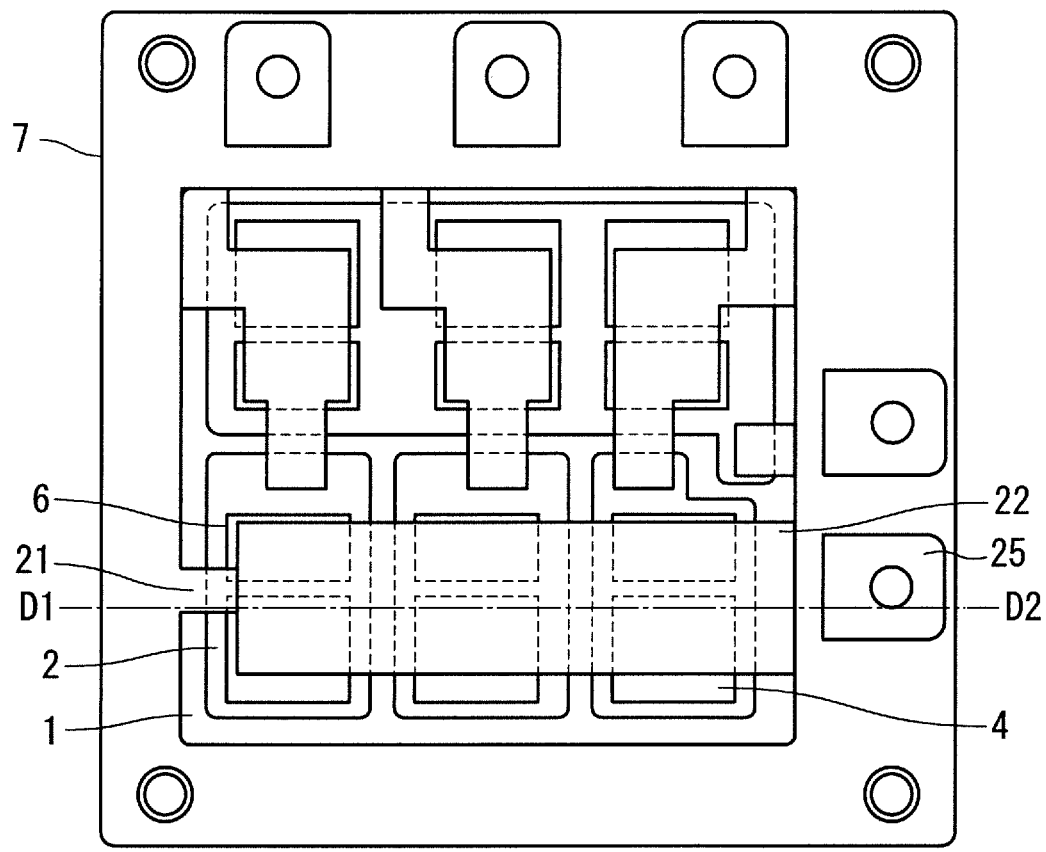
FIG. 7 is a plan view illustrating a configuration example of a semiconductor device according to Embodiment 4 of the present invention.
Figure 8:
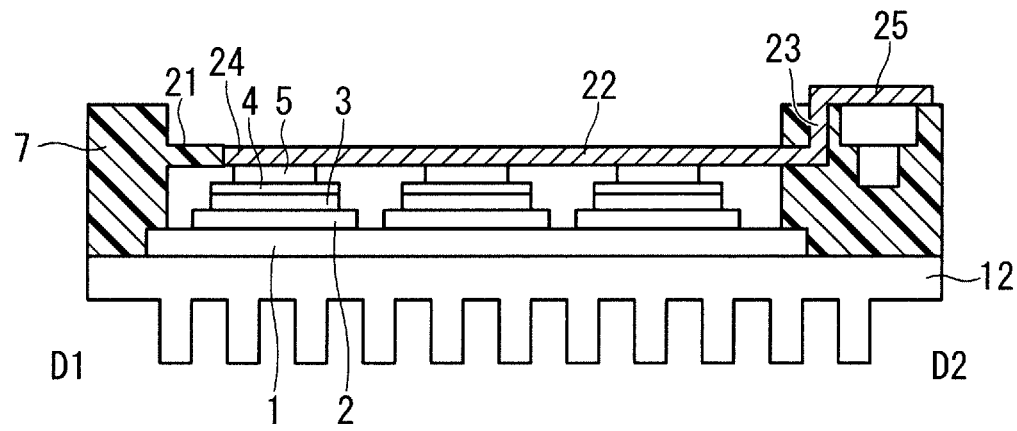
FIG. 8 is a cross-sectional view taken along line D1-D2 in FIG. 7.

FIG. 7 is a plan view illustrating a configuration example of a semiconductor device according to Embodiment 4. FIG. 8 is a cross-sectional view taken along line D1-D2 in FIG. 7. Note that FIGS. 7 and 8 illustrate the state before a resin is injected into a resin case 7.

As illustrated in FIGS. 7 and 8, the semiconductor device according to Embodiment 4 is characterized by a resin case 7 and a wiring member 22. Other configurations are the same as those of the semiconductor device according to the related art illustrated in FIGS. 11 and 12; therefore, description thereof will be omitted here.

The resin case 7 is provided on the periphery of a substrate 1 and has a protrusion 21 in which a part thereof protrudes inward.

The wiring member 22 has an exposed portion 25 adjacent to a first fixing portion 23 fixed in the wall surface of the resin case 7 and exposed to the outside, and a second fixing portion 24 fixed to the protrusion 21 at a position different from a first fixing portion 23, in which the wiring member 22 is bonded to the surface of the semiconductor elements 4 and 6 opposite to the substrate 1 by the solder 5, and has a plate shape having a length, a thickness, and a width. Further, the wiring member 22 has a uniform thickness and is flat in the resin case 7, and is not subject to bending.

As described above, according to Embodiment 4, the protrusion 21 of the resin case 7 alleviates the strain generated when it is at high temperature; therefore, the position in the height direction of the wiring member 22 does not shift. Therefore, the accuracy of the position in the height direction of the wiring member 22 is improved. Further, the accuracy of the position in the height direction of the wiring member 22 is improved; therefore, a favorable bonding state between the wiring member 22 and the semiconductor elements 4 and 6 by the solder 5 is established. Further, the wiring member 22 is not subject to bending, the cost of the wiring member 8 can be suppressed and the processing of the wiring member 22 is facilitated.

Embodiment 5

Figure 9:
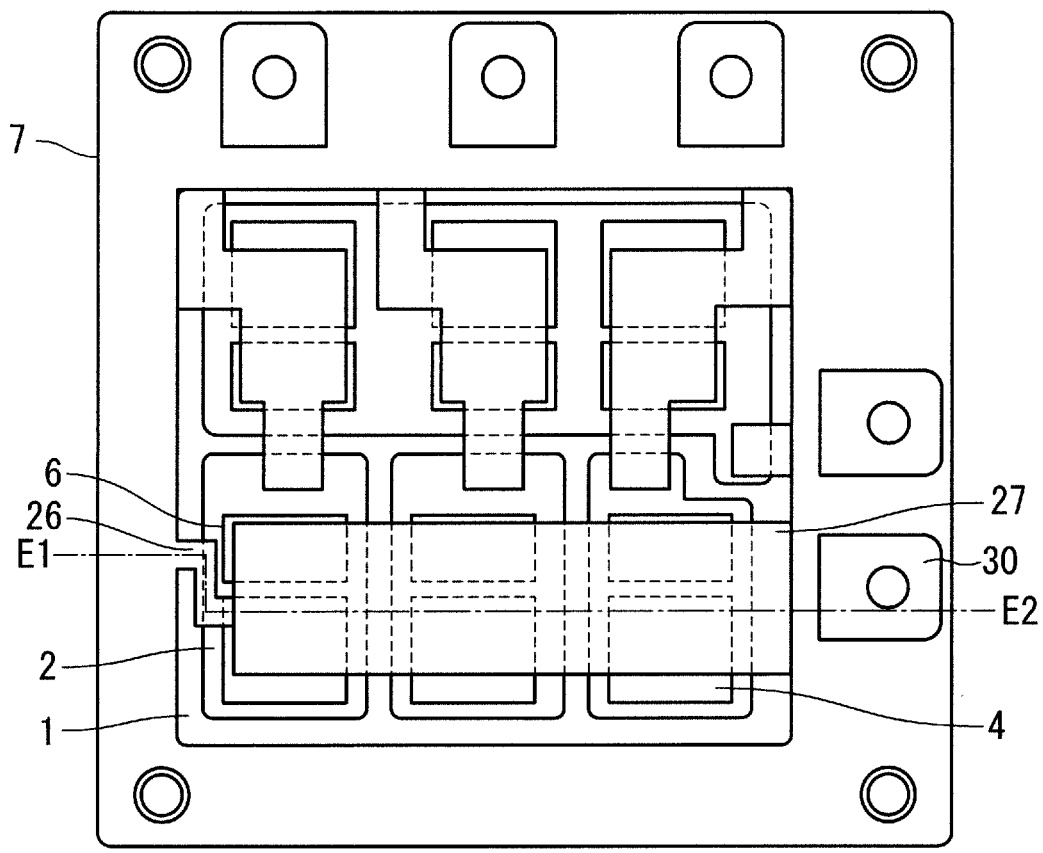
FIG. 9 is a plan view illustrating a configuration example of a semiconductor device according to Embodiment 5 of the present invention.
Figure 10:
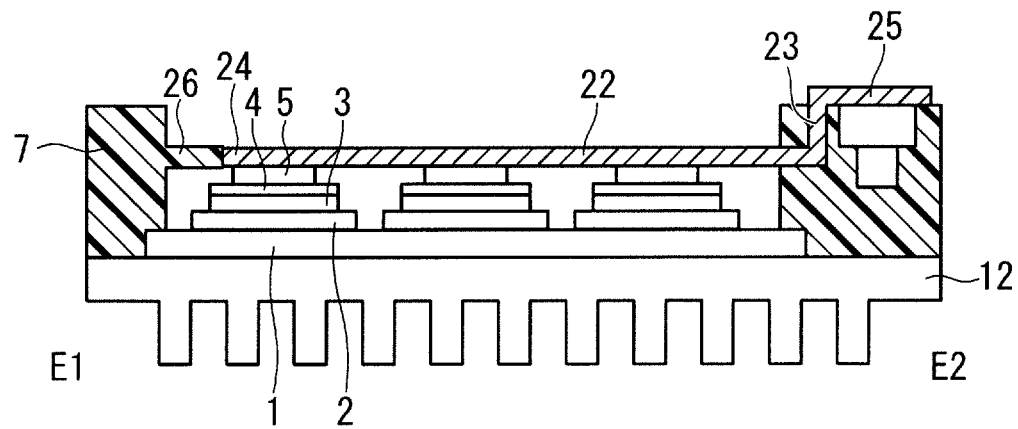
FIG. 10 is a cross-sectional view taken along line E1-E2 in FIG. 9.

FIG. 9 is a plan view illustrating a configuration example of a semiconductor device according to Embodiment 5. FIG. 10 is a cross-sectional view taken along line E1-E2 in FIG. 9. Note that FIGS. 9 and 10 illustrate the state before a resin is injected into a resin case 7.

As illustrated in FIGS. 9 and 10, the semiconductor device according to Embodiment 5 is characterized by a resin case 7. Other configurations are the same as those of the semiconductor device according to Embodiment 4 illustrated in FIGS. 7 and 8; therefore, the detail description thereof will be omitted here.

The protrusion 26 of the resin case 7 has a bent shape in a plan view. Specifically, the protrusion 26 has a crank shape. In the example of FIGS. 9 and 10, although a case is illustrated where the protrusion 26 has a crank shape, the present invention is not limited thereto. For example, the protrusion 26 may have a curved shape.

As described above, according to Embodiment 5, by forming the protrusion 26 of the resin case 7 into a bent shape, the effect of alleviating the strain is enhanced more than that with the semiconductor device according to Embodiment 4.

It should be noted that Embodiments of the present invention can be arbitrarily combined and can be appropriately modified or omitted without departing from the scope of the invention.

While the invention has been described in detail, the forgoing description is in all aspects illustrative and not restrictive. It is understood that numerous other modifications and variations can be devised without departing from the scope of the invention.

Explanation of Reference Signs

1 substrate, 2 circuit pattern, 3 solder, 4 semiconductor element, 5 solder, 6 semiconductor element, 7 resin case, 8 wiring member, 9 first fixing portion, 10 second fixing portion, 11 exposed portion, 12 heat sink, 13 wiring member, 14 first fixing portion, 15 second fixing portion, 16 exposed portion, 17 wiring member, 18 first fixing portion, 19 second fixing portion, 20 exposed portion, 21 protrusion, 22 wiring member, 23 first fixing portion, 24 second fixing portion, 25 exposed portion, 26 protrusion, 27, 28 wiring member, 29 circuit pattern, 30, 31 wiring member.

The invention claimed is:

1. A semiconductor device comprising:
   a substrate provided with a semiconductor element;
   a resin case provided on a periphery of the substrate; and
   a wiring member having:
      a first fixing portion directly fixed and embedded inside a wall surface of the resin case,
      an exposed portion that is a first end portion of the wiring member adjacent to the first fixing portion and that is exposed to outside, and
      a second fixing portion that is a second end portion of the wiring member opposite to the first end portion and that is directly fixed and embedded inside the wall surface of the resin case at a position different from the first fixing portion with respect to a portion extending from the first fixing portion into the resin case,
      in which the wiring member is bonded to a surface of the semiconductor element opposite to the substrate by solder in the resin case, and has a plate shape having a length, a thickness, and a width, wherein
   the wiring member has the thickness being uniform and is flat in the resin case, and the width of the second fixing portion is narrower than the width of the exposed portion.

2. The semiconductor device according to claim 1, wherein
   the second fixing portion has a bent shape in a plan view.

3. The semiconductor device according to claim 1, wherein
   the second fixing portion is fixed in the wall surface adjacent to the wall surface of the resin case to which the first fixing portion is fixed.

4. A semiconductor device comprising:
   a substrate provided with a semiconductor element;
   a resin case provided on a periphery of the substrate and having a protrusion in which a part thereof protrudes inward; and
   a wiring member having:
      a first fixing portion directly fixed and embedded inside a wall surface of the resin case;
      an exposed portion that is a first end portion of the wiring member adjacent to the first fixing portion and that is exposed to outside, and
      a second fixing portion that is a second end portion of the wiring member opposite to the first end portion and that is directly fixed to the protrusion at a position different from the first fixing portion,
      in which the wiring member is bonded to a surface of the semiconductor element opposite to the substrate by solder, and has a plate shape having a length, a thickness, and a width, wherein
   the wiring member has the thickness being uniform and is flat in the resin case.

5. The semiconductor device according to claim 4, wherein
   the protrusion has a bent shape in a plan view.

* * * * *